(12) United States Patent
Yeo et al.

(10) Patent No.: US 7,071,052 B2
(45) Date of Patent: Jul. 4, 2006

(54) RESISTOR WITH REDUCED LEAKAGE

(75) Inventors: Yee-Chia Yeo, Hsin-Chu (TW);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/667,871

(22) Filed: Sep. 22, 2003

(65) Prior Publication Data
US 2005/0040493 A1    Feb. 24, 2005

Related U.S. Application Data

(60) Provisional application No. 60/496,310, filed on Aug. 18, 2003.

(51) Int. Cl.
    *H01L 21/8249*    (2006.01)
(52) U.S. Cl. ........................... 438/238; 438/381
(58) Field of Classification Search .............. 438/238, 438/381–385; 257/538
    See application file for complete search history.

(56) References Cited

U.S. PATENT DOCUMENTS

| | | | |
|---|---|---|---|
| 4,069,094 A | 1/1978 | Shaw et al. | |
| 4,314,269 A | 2/1982 | Fujiki | |
| 4,497,683 A | 2/1985 | Celler et al. | |
| 4,631,803 A | 12/1986 | Hunter et al. | |
| 4,946,799 A | 8/1990 | Blake et al. | |
| 5,155,571 A | 10/1992 | Wang et al. | |
| 5,273,915 A * | 12/1993 | Hwang et al. | 438/155 |
| 5,338,960 A * | 8/1994 | Beasom | 257/335 |
| 5,378,919 A | 1/1995 | Ochiai | |
| 5,447,884 A | 9/1995 | Fahey et al. | |
| 5,461,250 A | 10/1995 | Burghartz et al. | |
| 5,479,033 A | 12/1995 | Baca et al. | |
| 5,534,713 A | 7/1996 | Ismail et al. | |
| 5,629,544 A | 5/1997 | Voldman et al. | |
| 5,656,524 A * | 8/1997 | Eklund et al. | 438/238 |
| 5,708,288 A | 1/1998 | Quigley et al. | |
| 5,714,777 A | 2/1998 | Ismail et al. | |

(Continued)

FOREIGN PATENT DOCUMENTS

EP    0683522 A2    11/1995

(Continued)

OTHER PUBLICATIONS

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

(Continued)

*Primary Examiner*—Jennifer Kennedy
(74) *Attorney, Agent, or Firm*—Slater & Matsil, L.L.P.

(57) ABSTRACT

A resistor 100 is formed in a semiconductor layer 106, e.g., a silicon layer on an SOI substrate. A body region 108 is formed in a portion of the semiconductor layer 106 and is doped to a first conductivity type (e.g., n-type or p-type). A first contact region 110, which is also doped to the first conductivity type, is formed in the semiconductor layer 106 adjacent the body region 108. A second contact region 112 is also formed in the semiconductor layer 106 and is spaced from the first contact region 110 by the body region 108. A dielectric layer 116 overlies the body region and is formed from a material with a relative permittivity greater than about 8. An electrode 114 overlies the dielectric 116.

30 Claims, 6 Drawing Sheets

U.S. PATENT DOCUMENTS

| | | | |
|---|---|---|---|
| 5,763,315 | A | 6/1998 | Benedict et al. |
| 5,789,807 | A | 8/1998 | Correale, Jr. |
| 5,811,857 | A | 9/1998 | Assaderaght et al. |
| 5,955,766 | A | 9/1999 | Ibi et al. |
| 5,972,722 | A * | 10/1999 | Visokay et al. ............. 438/3 |
| 6,008,095 | A | 12/1999 | Gardner et al. |
| 6,015,993 | A | 1/2000 | Voldman et al. |
| 6,046,487 | A | 4/2000 | Benedict et al. |
| 6,059,895 | A | 5/2000 | Chu et al. |
| 6,100,153 | A * | 8/2000 | Nowak et al. ............. 438/382 |
| 6,103,599 | A * | 8/2000 | Henley et al. ............. 438/459 |
| 6,107,125 | A * | 8/2000 | Jaso et al. ................. 438/149 |
| 6,111,267 | A | 8/2000 | Fischer et al. |
| 6,222,234 | B1 | 4/2001 | Imai |
| 6,232,163 | B1 | 5/2001 | Voldman et al. |
| 6,256,239 | B1 | 7/2001 | Akita et al. |
| 6,258,664 | B1 | 7/2001 | Reinberg |
| 6,281,059 | B1 * | 8/2001 | Cheng et al. ............. 438/200 |
| 6,291,321 | B1 | 9/2001 | Fitzgerald |
| 6,294,834 | B1 | 9/2001 | Yeh et al. |
| 6,339,232 | B1 | 1/2002 | Takagi |
| 6,358,791 | B1 | 3/2002 | Hsu et al. |
| 6,387,739 | B1 | 5/2002 | Smith, III |
| 6,407,406 | B1 | 6/2002 | Tezuka |
| 6,413,802 | B1 | 7/2002 | Hu et al. |
| 6,414,355 | B1 | 7/2002 | An et al. |
| 6,429,061 | B1 | 8/2002 | Rim |
| 6,448,114 | B1 | 9/2002 | An et al. |
| 6,475,838 | B1 | 11/2002 | Bryant et al. |
| 6,475,869 | B1 | 11/2002 | Yu |
| 6,489,664 | B1 | 12/2002 | Re et al. |
| 6,518,610 | B1 | 2/2003 | Yang et al. |
| 6,521,952 | B1 | 2/2003 | Ker et al. |
| 6,524,905 | B1 | 2/2003 | Yamamichi et al. |
| 6,525,403 | B1 | 2/2003 | Inaba et al. |
| 6,555,839 | B1 | 4/2003 | Fitzgerald |
| 6,558,998 | B1 | 5/2003 | Belleville et al. |
| 6,573,172 | B1 | 6/2003 | En et al. |
| 6,576,526 | B1 | 6/2003 | Kai et al. |
| 6,586,311 | B1 * | 7/2003 | Wu ............................. 438/382 |
| 6,600,170 | B1 | 7/2003 | Xiang |
| 6,617,643 | B1 | 9/2003 | Goodwin-Johansson |
| 6,621,131 | B1 | 9/2003 | Murthy et al. |
| 6,633,070 | B1 | 10/2003 | Miura et al. |
| 6,653,700 | B1 | 11/2003 | Chau et al. |
| 6,657,276 | B1 | 12/2003 | Karlsson et al. |
| 6,686,247 | B1 * | 2/2004 | Bohr ......................... 438/301 |
| 6,720,619 | B1 | 4/2004 | Chen et al. |
| 6,724,019 | B1 | 4/2004 | Oda et al. |
| 6,759,717 | B1 | 7/2004 | Sagarwala et al. |
| 6,762,448 | B1 | 7/2004 | Lin et al. |
| 6,784,101 | B1 * | 8/2004 | Yu et al. .................... 438/666 |
| 6,794,764 | B1 | 9/2004 | Kamal et al. |
| 6,803,641 | B1 | 10/2004 | Papa Rao et al. |
| 6,891,192 | B1 | 5/2005 | Chen et al. |
| 2002/0031890 | A1 | 3/2002 | Watanabe et al. |
| 2002/0074598 | A1 | 6/2002 | Doyle et al. |
| 2002/0076899 | A1 | 6/2002 | Skotnicki et al. |
| 2002/0125471 | A1 | 9/2002 | Fitzgerald et al. |
| 2002/0153549 | A1 | 10/2002 | Laibowitz et al. |
| 2002/0190284 | A1 | 12/2002 | Murthy et al. |
| 2003/0001219 | A1 | 1/2003 | Chau et al. |
| 2003/0030091 | A1 | 2/2003 | Bulsara et al. |
| 2003/0080386 | A1 | 5/2003 | Ker et al. |
| 2004/0026765 | A1 | 2/2004 | Currie et al. |
| 2004/0087098 | A1 * | 5/2004 | Ng et al. ................... 438/381 |
| 2004/0173815 | A1 | 9/2004 | Yeo et al. |
| 2005/0029601 | A1 | 2/2005 | Chen et al. |
| 2005/0224986 | A1 * | 10/2005 | Tseng et al. ............. 257/762 |
| 2005/0236694 | A1 * | 10/2005 | Wu et al. .................. 257/632 |

FOREIGN PATENT DOCUMENTS

| | | |
|---|---|---|
| EP | 0828296 A2 | 3/1998 |
| WO | WO 03/017336 A2 | 2/2003 |

OTHER PUBLICATIONS

Yeoh, J.C. et al., "MOS Gated Si:SiGe Quantum Wells Formed by Anodic Oxidation," Semicond. Sci. Technol. (1998), vol. 13, pp. 1442-1445, IOP Publishing Ltd., UK.

Cavassilas, N., et al., "Capacitance-Voltage Characteristics of Metal-Oxide-Strained Semiconductor Si/SiGe Heterostructures," Nanotech 2002, vol. 1, pp. 600-603.

Blaauw, D., et al., "Gate Oxide and Subthreshold Leakage Characterization, Analysis and Optimization," date unknown.

"Future Gate Stack," International Sematech, 2001 Annual Report.

Chang, L., et al., "Reduction of Direct-Tunneling Gate Leakage Current in Double-Gate and Ultra-Thin Body MOSFETs," 2001 IEEE, Berkeley, CA.

Chang, L., et al., "Direct-Tunneling Gate Leakage Current in Double-Gate and Ultrathin Body MOSFETs," 2002 IEEE, vol. 49, No. 12, Dec. 2002.

Ismail, K, et al., "Electron Transport Properties of Si/SiGe Heterostructures: Measurements and Device Implications," Applied Physics Letters, vol. 63, No. 5, (Aug. 2, 1993), pp. 660-662.

Nayak, D.K., et al., "Enhancement-Mode Quantum-Well $Ge_xSi_{1-x}$ PMOS," IEEE Electron Device Letters, vol. 12, No. 4, (Apr. 1991), pp. 154-156.

Gámiz, F., et al., "Strained-Si/SiGe-on-Insulator Inversion Layers: The Role of Strained-Si Layer Thickness on Electron Mobility," Applied Physics Letters, vol. 80, No. 22, (Jun. 3, 2002), pp. 4160-4162.

Gámiz, F., et al., "Electron Transport in Strained Si Inversion Layers Grown on SiGe-on-Insulator Substrates," Journal of Applied Physics, vol. 92, No. 1, (Jul. 1, 2002), pp. 288-295.

Mizuno, T., et al., "Novel SOI p-Channel MOSFETs With Higher Strain in Si Channel Using Double SiGe Heterostructures," IEEE Transactions on Electron Devices, vol. 49, No. 1, (Jan. 2002), pp. 7-14.

Tezuka, T., et al., "High-Performance Strained Si-on-Insulator MOSFETs by Novel Fabrication Processes Utilizing Ge-Condensation Technique," Symposium On VLSI Technology Digest of Technial Papers, (2002), pp. 96-97.

Jurczak, M., et al., "Silicon-on-Nothing (SON)—an Innovative Process for Advanced CMOS," IEEE Transactions on Electron Devices, vol. 47, No. 11, (Nov. 2000), pp. 2179-2187.

Jurczak, M., et al., "SON (Silicon on Nothing)—A New Device Architecture for the ULSI ERA," Symposium on VLSI Technology Digest of Technical Papers, (1999), pp. 29-30.

Maiti, C.K., et al., "Film Growth and Material Parameters," Application of Silicon-Germanium Heterostrucutre, Institute of Physics Publishing, Ch. 2 (2001) pp. 32-42.

Tiwari, S., et al., "Hole Mobility Improvement in Silicon-on-Insulator and Bulk Silicon Transistors Using Local Strain," International Electron Device Meeting, (1997), pp. 939-941.

Ootsuka, F., et al., "A Highly Dense, High-Performance 130nm Node CMOS Technology for Large Scale System-on-a-Chip Applications," International Electron Device Meeting, (2000), pp. 575-578.

Matthews, J.W., et al., "Defects in Epitaxial Multilayers—I. Misfit Dislocations," Journal of Crystal Growth, vol. 27, (1974), pp. 118-125.

Matthews, J.W., et al., "Defects in Epitaxial Multilayers—II. Dislocation Pile-Ups, Threading Dislocations, Slip Lines and Cracks," Journal of Crystal Growth, vol. 29, (1975), pp. 273-280.

Matthews, J.W., et al., "Defects in Epitaxial Multilayers—III. Preparation of Almost Perfect Multilayers," Journal of Crystal Growth, vol. 32, (1976), pp. 265-273.

Schüppen, A., et al., "Mesa and Planar SiGe-HBTs on MBE-Wafers," Journal of Materials Science: Materials in Electronics, vol. 6, (1995), pp. 298-305.

Matthews, J.W., "Defects Associated with the Accommodation of Misfit Between Crystals," J. Vac. Sci. Technol., vol. 12, No. 1 (Jan./Feb. 1975), pp. 126-133.

Huang, X., et al., "Sub-50 nm P-Channel FinFET," IEEE Transactions on Electron Devices, vol. 48, No. 5, May 2001, pp. 880-886.

Shahidi, G.G., "SOI Technology for the GHz Era," IBM J. Res. & Dev., vol. 46, No. 2/3, Mar./May 2002, pp. 121-131.

Shimizu, A., et al., "Local Mechanical Stress Control (LMC): A New Technique for CMOS-Performance Enhancement," IEDM 2001, pp. 433-436.

Wong, H.-S.P., "Beyond the Conventional Transistor," IBM J. Res. & Dev., vol. 46, No. 2/3, Mar./May 2002, pp. 133-167.

Yang, F.L., et al., "25 nm CMOS Omega FETs," IEDM 2002, pp. 255-258.

Yang, F.L., et al, "35nm CMOS FinFETs," 2002 Symposium on VLSI Technology Digest of Technical Papers, 2002, pp. 104-105.

Thompson, S., et al., "A 90 nm Logic Technology Featuring 50nm Strained Silicon Channel Transistors, 7 Layers of Cu Interconnects, Low k ILD, and 1 um$^2$ SRAM Cell," IEDM, pp. 61-64.

Welser, J., et al., "NMOS and PMOS Transistors Fabricated in Strained Silicon/Relaxed Silicon-Germanium Structures," IEDM 1992, pp. 1000-1002.

Leitz, C. W., et al., "Hole mobility enhancements in strained Si/Si$_{1-y}$Ge$_y$ p-type metal-oxide-semiconductor field-effect transistors grown on relaxed Si$_{1-x}$Ge$_x$ (x<y) virtual substrates," Applied Physics Letters, Dec. 17, 2001, pp. 4246-4248, vol. 79, No. 25.

Leitz, C. W., et al., "Channel Engineering of SiGe-Based Heterostructures for High Mobility MOSFETs," Mat. Res. Soc. Symp. Proc., 2002, pp. 113-118, vol. 686.

Liu, K. C., et al., "A Novel Sidewall Strained-Si Channel nMOSFET," IEDM, 1999, pp. 63-66.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration, Lattice Press, Sunset Beach, California, 1990, pp. 144-145.

* cited by examiner

RESISTOR WITH REDUCED LEAKAGE

This application claims the benefit of U.S. Provisional Application No. 60/496,310, filed on Aug. 18, 2003, which application is hereby incorporated herein by reference.

CROSS-REFERENCE TO RELATED APPLICATIONS

This application relates to the following patents and co-pending, commonly-assigned patent applications. Each of these documents is incorporated herein by reference.

| Pat. No. or Ser. No. | Filing Date | Issue Date |
|---|---|---|
| 10/641,813 | Aug. 15, 2003 | — |
| 10/628,020 | Jul. 25, 2003 | — |

TECHNICAL FIELD

The present invention relates generally to semiconductor devices and more particularly to a resistor with reduced leakage.

BACKGROUND

Resistors are commonly used in semiconductor integrated circuits. Resistors are used, for example, in analog and in mixed mode analog and digital circuits. Resistors are also used in input and output circuits as input and output resistors.

In integrated circuits formed on silicon-on-insulator substrates, a resistor may be formed in a portion of a single crystal silicon layer. Such a single crystal resistor has high stability and low noise, compared with conventional polycrystalline resistor structures. Resistors should also have low parasitic capacitance. Resistors formed on silicon-on-insulator substrates have extremely low parasitic capacitance due to full dielectric isolation and the insulating substrate.

In resistors formed on silicon-on-insulator substrates, the resistor body is usually formed below a silicon oxide layer, which underlies a polycrystalline silicon layer. The polycrystalline silicon layer is usually connected to one of the two terminals of the resistor. With complementary metal-oxide-semiconductor (CMOS) technology scaling, the thickness of the silicon oxide layer is progressively reduced. As the thickness of silicon oxide layer is reduced, leakage current between the polycrystalline silicon layer and the resistor body increases. The increased leakage current results in increased noise.

In addition, resistors are sometimes used as part of an input protection circuit to provide protection of the circuit against electrostatic discharge (ESD) events. In this case, the resistor is used to both attenuate the ESD voltage and also to absorb ESD energy. Large voltages in the order of thousands of volts may appear across the two terminals of the resistor used for ESD applications. Since the polycrystalline silicon layer and the resistor body are connected to the two terminals of the resistor, the silicon oxide layer between the polycrystalline silicon layer and the resistor body may potentially breakdown.

SUMMARY OF THE INVENTION

In the preferred embodiment, a resistor with reduced leakage and noise is provided. A method of fabricating the resistor is also provided.

In accordance with a preferred embodiment of the present invention, a resistor is formed in a semiconductor layer, e.g., a silicon layer on an SOI substrate. A body region is formed in a portion of the semiconductor layer and is doped to a first conductivity type. A first contact region, which is also doped to the first conductivity type, is formed in the semiconductor layer adjacent the body region. A second contact region is also formed in the semiconductor layer spaced from the first contact region by the body region. The second contact region is doped to the first conductivity type. A dielectric layer overlies the body region and is formed from a material with a relative permittivity greater than about 8. An electrode overlies the dielectric.

According to another aspect of the invention, a silicon-on-insulator resistor includes a silicon layer that overlies an insulator layer. A body region is formed in a portion of the silicon layer and a dielectric layer overlies the body region. Preferably, the dielectric is a high permittivity dielectric layer. A top electrode overlies the dielectric layer and a pair of doped regions are formed in the silicon layer oppositely adjacent the body region. The pair of doped regions is doped to the same conductivity type as the body region.

In yet another embodiment, a silicon-on-insulator device includes a substrate and an insulator layer overlying the substrate. An active area is formed in a silicon layer overlying the insulator layer. A body region of a first conductivity type is formed in a portion of the silicon layer. An interfacial layer, e.g., $SiO_2$ or SiON, overlies and abuts the body region. A high-k dielectric layer, e.g., a layer having a relative permittivity greater than about 8, overlies the interfacial layer. A top electrode overlies the high-k dielectric layer. A pair of doped regions of the first conductivity type are formed in the active area oppositely adjacent the body region.

A resistor of the preferred embodiment can be formed by providing a silicon-on-insulator substrate that includes a silicon layer overlying an insulator layer. A resistor body of a first conductivity type is formed in a portion of the silicon layer, e.g., by doping the portion of the layer. A dielectric layer, e.g., with a relative permittivity greater than about 8, overlies the body region. A top electrode is formed on the dielectric layer and a pair of doped regions are formed oppositely adjacent the body region.

BRIEF DESCRIPTION OF THE DRAWINGS

For a more complete understanding of the present invention, and the advantages thereof, reference is now made to the following descriptions taken in conjunction with the accompanying drawing, in which:

FIGS. 3b and 3c show cross sectional views of the resistor of FIG. 3a;

DETAILED DESCRIPTION OF ILLUSTRATIVE EMBODIMENTS

In aspects of this invention, resistors with reduced leakage current are taught. Such resistors may be formed on a semiconductor-on-insulator (SOI) substrate. In the preferred embodiment, the semiconductor-on-insulator substrate is a silicon-on-insulator substrate having a silicon layer overlying a silicon oxide layer which in turn overlies a substrate. The silicon layer in the silicon-on-insulator substrate may be relaxed silicon or strained silicon.

Figure 1:
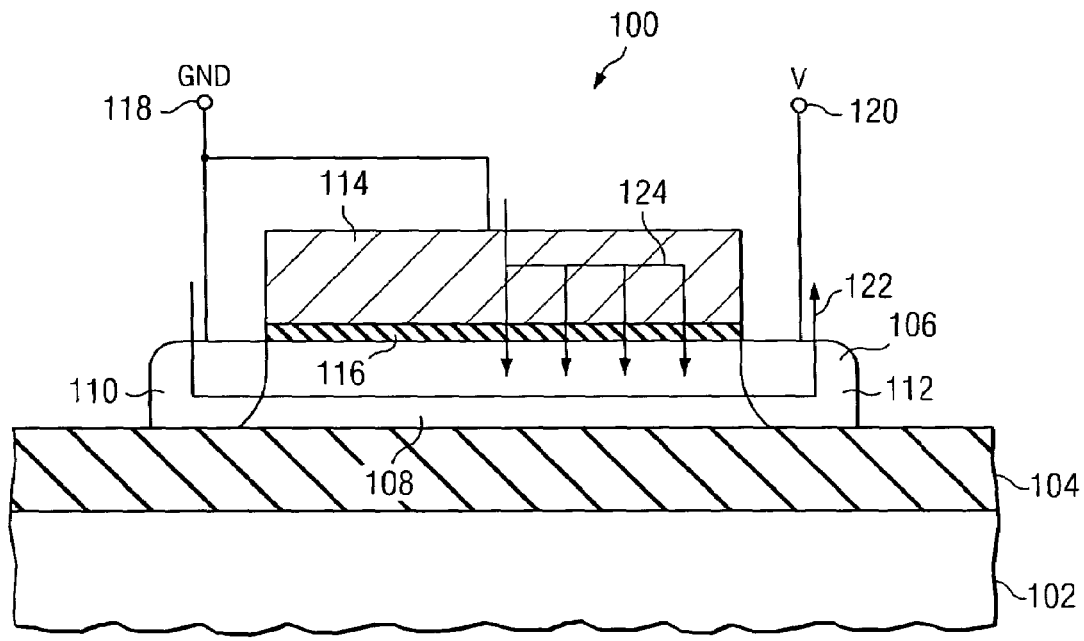
FIG. 1 shows a first embodiment silicon-on-insulator resistor.

Referring now to FIG. 1, a cross-section of a resistor 100 of the preferred embodiment is depicted. In this example, the device is formed on a silicon-on-insulator substrate, which includes a substrate 102, a buried insulator layer 104 and a semiconductor layer 106. The resistor has a body region 108, or resistor body 108, formed within a portion of the silicon layer 106. A pair of doped regions 110 and 112 are formed oppositely adjacent to the resistor body 108.

Although not shown in this figure, the doped regions may be silicided to form low resistance regions. In addition, to prevent the silicidation of the body region of the resistor, a stack comprising of a top electrode 114 (usually polycrystalline silicon) on a dielectric 116 is formed on the resistor body 108, as shown in FIG. 1. The dielectric 116 may be formed from the same dielectric layer used by transistors formed on other portions of the integrated circuit. Therefore, the thickness of the dielectric 116 tends to be scaled towards smaller thicknesses as technology progresses.

As shown substantially in FIG. 1, the doped regions 110 and 112 electrically communicate with other portions of the integrated circuit. For example, a first terminal 118 of the resistor 100 may be connected to ground potential (labeled GND), and a second terminal 120 may be connected to a circuit node with a potential V. The potential V may be at a potential higher than ground potential. As a result, a current flows through the resistor along a first current path 122. The resistor body 108 predominantly contributes to the resistance seen between the two terminals 118 and 120 of the resistor.

A second current path also exists between the two terminals 118 and 120 of the resistor. This path is labeled with reference number 124 in FIG. 1. The second current path 124 shunts the first current path 122, and may adversely affect the properties of the resistor 100. The current flowing along the second current path 124 increases with reduced dielectric 116 thickness. This is because when the dielectric thickness is small, quantum mechanical tunneling of charge carriers may occur through the dielectric 116. According to the preferred embodiment of this invention, by incorporating at least a high permittivity (high-k) material in the dielectric 116, the dielectric thickness may be increased while maintaining the same capacitive properties. As a result of the increase of the dielectric thickness, the leakage current flowing along the second current path 124 may be significantly suppressed.

Therefore, in the preferred embodiment of the present invention, the dielectric 116 that overlies the resistor body 108 comprises a high permittivity (high-k) dielectric. By using a high-k dielectric, the thickness of the dielectric 116 can be significantly larger than that if a silicon oxide dielectric is employed. The high-k dielectric preferably has a permittivity of larger than about 8, and more preferably has a permittivity of larger than about 10, and even more preferably has a permittivity of larger than about 20. The high permittivity dielectric 116 may be one of the following materials: aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), and combinations thereof. In the preferred embodiment, the high-k dielectric 116 is hafnium oxide. The dielectric 116 may additionally comprise silicon oxide ($SiO_2$), silicon oxynitride (SiON), or silicon nitride ($Si_3N_4$).

The silicon oxide equivalent thickness (EOT) of the dielectric is preferably larger than about 5 angstroms, more preferably larger than about 10 angstroms, and even more preferably larger than about 20 angstroms. The physical thickness of the dielectric may be larger than about 5 angstroms, more preferably larger than about 20 angstroms, and even more preferably larger than about 40 angstroms.

The top electrode 114 comprises a conductive material such as polycrystalline or amorphous silicon, polycrystalline silicon-germanium, a metal, a metallic nitride, a metallic silicide, or a metallic oxide, and combinations thereof. In the preferred embodiment, the top electrode 114 comprises polycrystalline silicon possibly in combination with a silicide layer.

Metals such as molybdenum, tungsten, titanium, tantalum, platinum, and hafnium may be used as the portion of the top electrode 114. Metallic nitrides may include, but will not be restricted to, molybdenum nitride, tungsten nitride, titanium nitride, and tantalum nitride. Metallic silicides may include, but will not be restricted to, nickel silicide, cobalt silicide, tungsten silicide, titanium silicide, tantalum silicide, platinum silicide, and erbium silicide. Metallic oxides may include, but will not be restricted to, ruthenium oxide and indium tin oxide.

It should be noted that the resistor body 108 thickness is preferably in the range of about 20 angstroms to about 1000 angstroms, and more preferably in the range of about 20 angstroms to about 400 angstroms. As such, the first current path 122 flows in close proximity to the interface between the resistor body 108 and the dielectric 116. As a result, measures should be taken to ensure that the interface 108/116 has a low interface trap density of less than about $10^{10}$ $cm^{-2}$. Interface traps result in charge carriers flowing in the resistor to be instantaneously trapped or detrapped, causing an instantaneously decrease or increase in the current, respectively. This manifests as a current noise source in the resistor.

Figure 2:
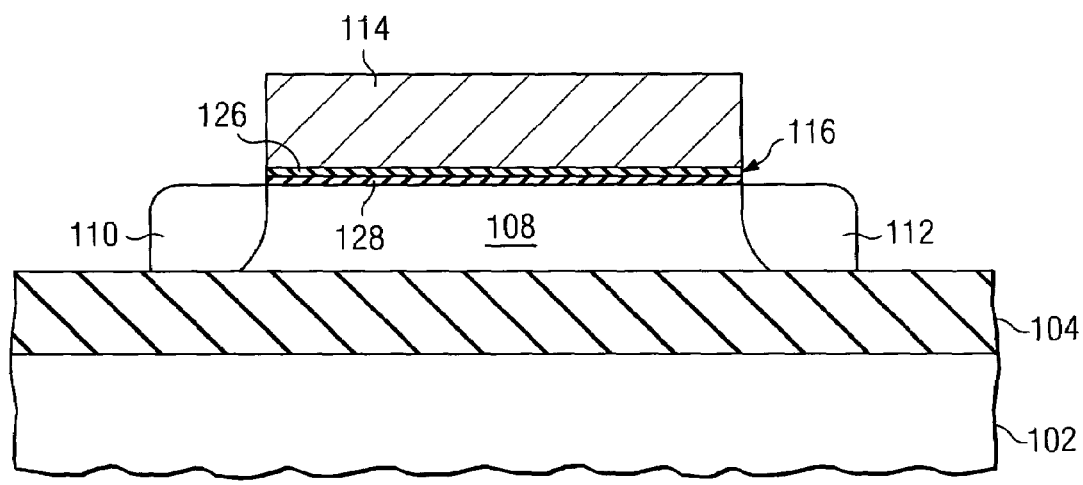
FIG. 2 shows a second embodiment silicon-on-insulator resistor.

To reduce the amount of current noise, the dielectric 116 overlying the resistor body 108 preferably comprises of at least two layers: a high-k dielectric 126 overlying an interfacial dielectric layer 128, as shown in FIG. 2. The interfacial dielectric layer 128 is preferably one that has excellent interfacial properties in contact with the resistor body 108. In the preferred embodiment, the interfacial layer 128 comprises silicon oxide (e.g., $SiO_2$) or silicon oxynitride (e.g., $SiO_xN_y$).

The resistor body 108 may be doped n-type or p-type. The doped regions 110 and 112 adjacent to the resistor body 108 are doped the same type as the resistor body 108. The doped regions 110 and 112 preferably have a high doping concentration, e.g., between about $10^{18}$ $cm^{-3}$ and about $5\times10^{21}$ $cm^{-3}$. The resistor body 108 has a doping concentration that is lower and is selected to provide the desired resistivity. Typical values are between about $10^{16}$ cm$^{-3}$ and $10^{19}$ cm$^{-3}$.

Figure 3A:
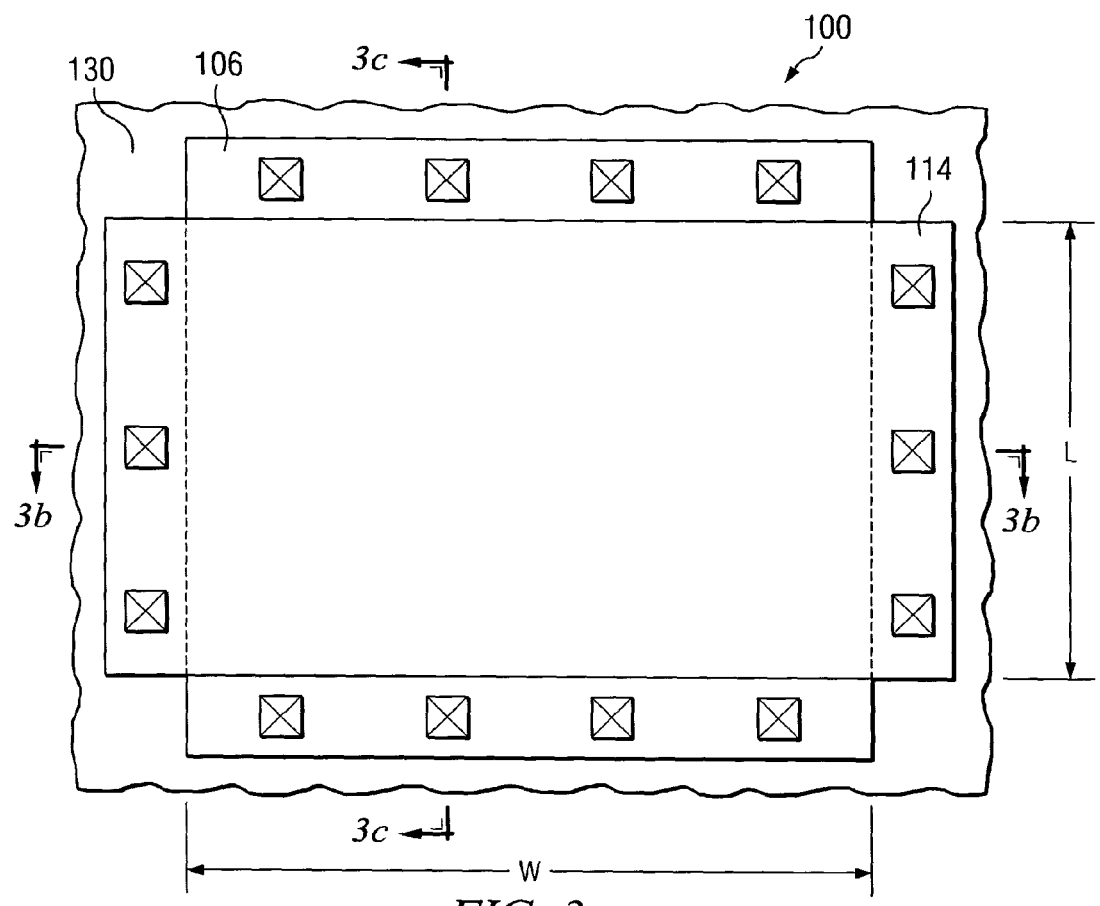
FIG. 3a shows a top view of a resistor of one embodiment of the invention.

FIG. 3a shows a top view or layout view of a resistor 100 of an embodiment of this invention. The resistor has a width W and a length L. In the preferred embodiment, the width W may have a dimension of larger than about 0.1 microns, and preferably larger than about 1 micron. In the preferred embodiment, the length L may have a dimension of larger than about 0.1 micron, and preferably larger than about 1 micron. The detailed structure of the resistor may be seen in cross-sectional views along the lines 3b–3b' and 3c–3c'.

Figure 3B:
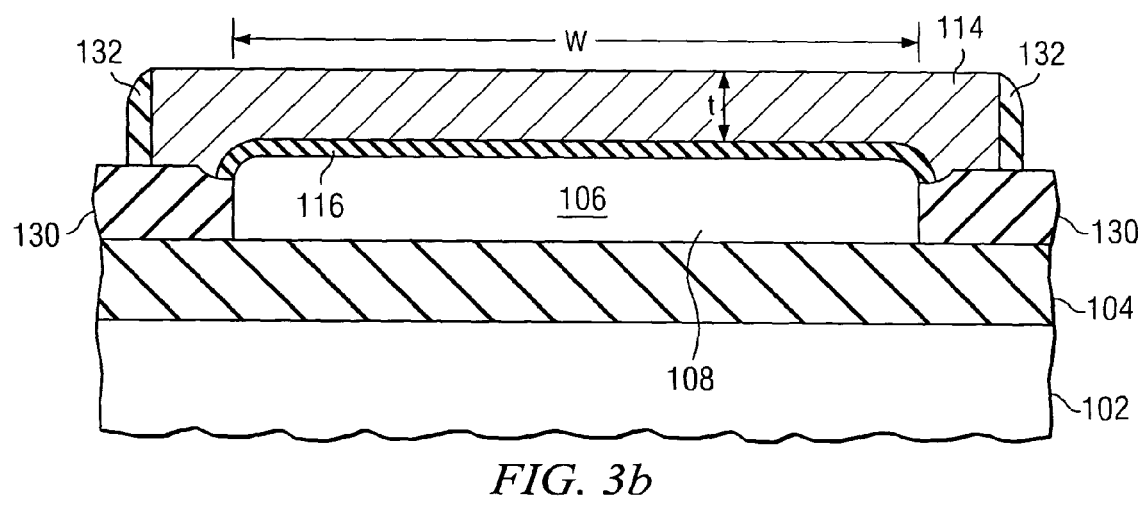

The detailed cross-sectional view along line 3b–3b' of FIG. 3a is shown in FIG. 3b. The top electrode 114 extends laterally into the isolation regions 130. The isolation region 116 may comprise isolation structures known and used in the art, such as shallow trench isolation. The shallow trench isolation structure may comprise a dielectric filling material such as chemical vapor deposited silicon oxide. The shallow trench isolation structure may also comprise trench liner oxide (not shown for simplicity) on the boundaries of the trench. The trench liner oxide may or may not contain nitrogen.

Other isolation types could alternately be used. For example, FIG. 1 showed an active region 106 surrounded by mesa isolation. It is understood that the resistor may be used in a semiconductor-on-insulator technology employing trench isolation, or may be used in a semiconductor-on-insulator technology employing mesa isolation. In mesa isolation, trenches are not filled with a dielectric filling material prior to the formation of transistors or resistors.

The top electrode in FIG. 3b is shown to have a thickness t, preferably in the range of about 200 angstroms to about 2000 angstroms. The resistor structure may additionally have spacers 132 formed on the sides of the top electrode 114. The top electrode 114 may be formed of the same material as the gate electrode of a transistor formed in another portion of the integrated circuit, as shown in FIG. 4.

Figure 3C:
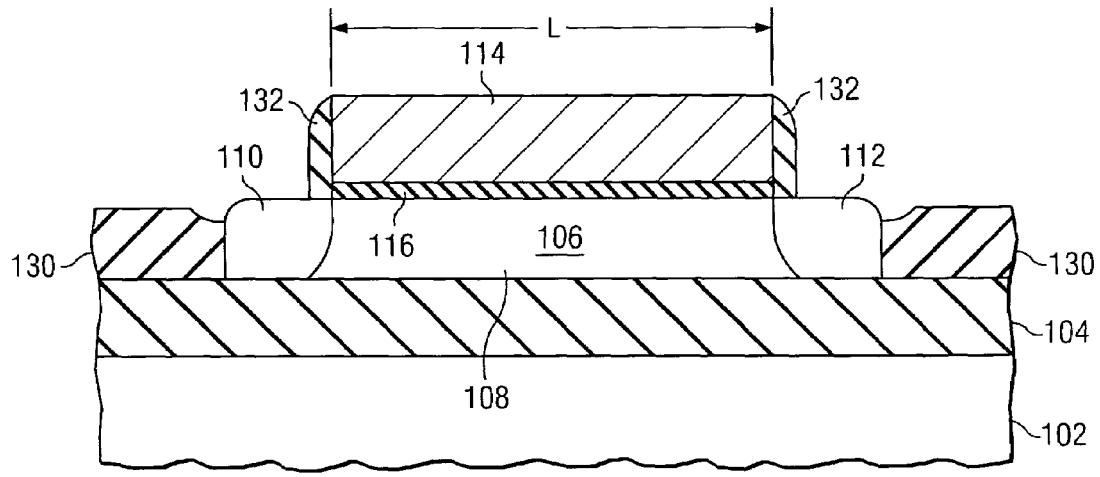

The cross-sectional view along line 3c–3c' is shown in FIG. 3c. This view shows the doped regions 110 and 112.

Figure 4:
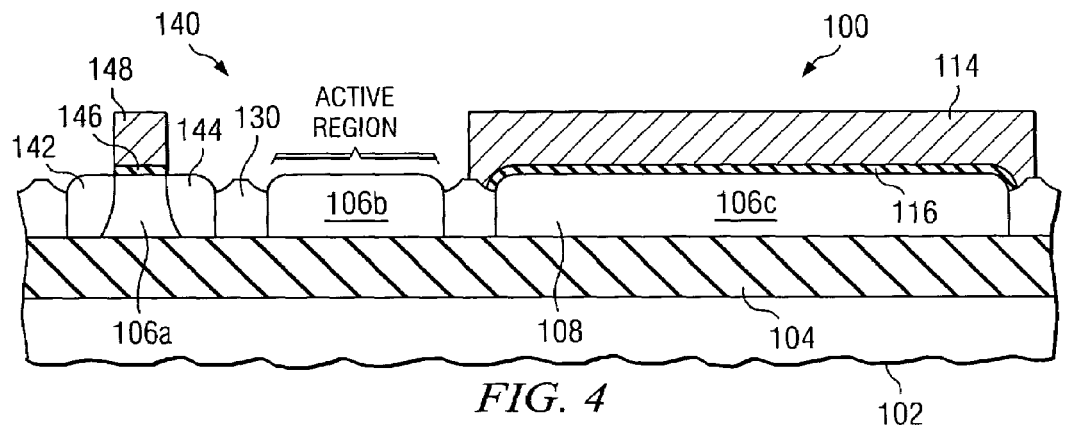
FIG. 4 shows an SOI transistor and resistor formed on the same chip.

Referring now to FIG. 4, the resistor 100 may be formed in an active region 106c in the vicinity of an active device 140 such as a transistor. In FIG. 4, transistor 140 is formed in active region 106a and includes source region 142, drain region 144, gate dielectric 146 and gate electrode 148. The resistor dielectric 116 may or may not be the same dielectric material as the transistor gate dielectric 146. The gate electrode 114 of the resistor 100 may or may not be formed of the same material as the gate electrode 148 of the transistor 140. In a typical embodiment, the distance between doped regions 110 and 112 is typically between about 2 and 100 times greater the channel length of transistor 140 (i.e., the distance between source and drain regions 142 and 144).

Figure 5A:
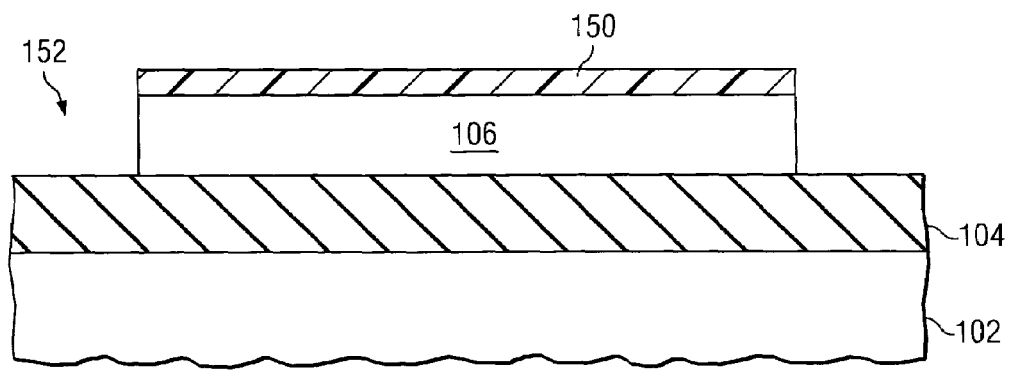
FIGS. 5a–5f show cross-sectional views of a device during various stages of fabrication.
Figure 5B:
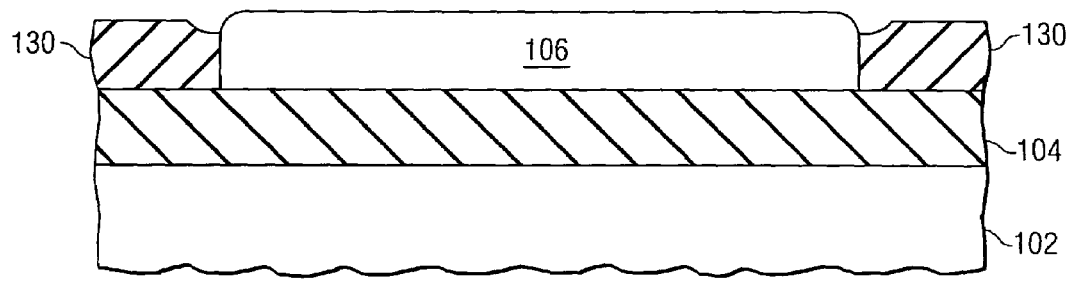

Next, a method of manufacturing the resistor is to be described with respect to FIGS. 5a–5f, which are taken along the same cross-sectional line as FIG. 3b. Referring first to FIG. 5a, a semiconductor-on-insulator substrate, including substrate 102, insulator 104 and semiconductor layer 106, is provided and an active region mask 150 is used to define trenches 152 in the semiconductor layer 106. The semiconductor layer 106 preferably has a thickness of about 1000 angstroms or thinner. The insulator 104 thickness is preferably about 1200 angstroms or thinner. The mask 150 preferably comprises silicon nitride, and more preferably comprises silicon nitride on a silicon oxide layer.

Trench filling dielectric material is deposited by chemical vapor deposition to fill the trenches 152, followed by a chemical mechanical planarization process step. These steps create isolation region 130. The mask 150 is then removed to give the cross-section shown in FIG. 5b.

An ion implantation process step may be performed to dope the active region, a portion of which will become the resistor body 108. The dose of the implantation will determine the resistivity of the semiconductor layer and therefore the resistance of the resistor. For example, an implant dose in the range of about $10^{13}$ to about $10^{16}$ cm$^{-2}$ may be used.

Figure 5C:
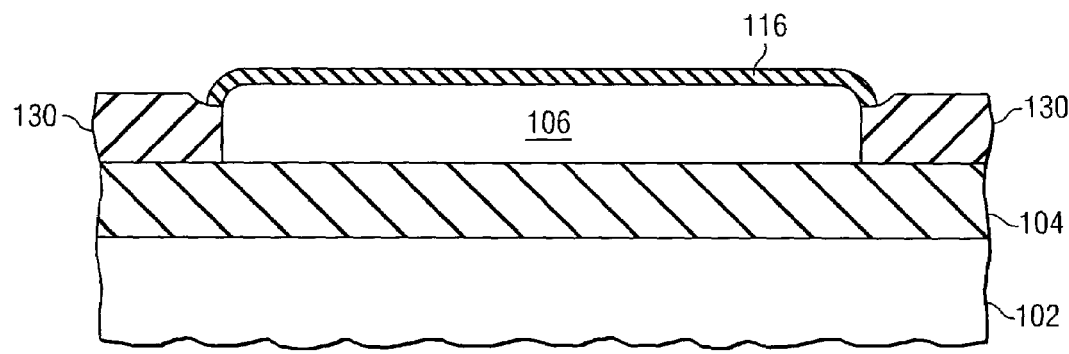

A dielectric 116 comprising a high-k material is then formed over the active region 106, as shown in FIG. 5c. The physical thickness of the dielectric may be larger than about 5 angstroms, more preferably larger than about 20 angstroms, and even more preferably larger than about 40 angstroms. Further, the dielectric may be smaller than about 200 angstroms, preferably smaller than about 100 angstroms and most preferably smaller than about 50 angstroms.

The dielectric 116 may be formed together with the formation of a transistor gate dielectric 146 in a different portion of the semiconductor chip (see FIG. 4). By forming the dielectric 116 together with the gate dielectric 146 of a transistor in a different portion of the chip, no additional process steps are introduced. High-k dielectric materials as previously described may be used. The high-k dielectric may be formed by chemical vapor deposition, sputter deposition, or other known techniques of forming high-k dielectric materials.

An interfacial layer (see FIG. 2) may be formed on the body region 108 prior to the formation of the high-k dielectric material. The interfacial layer may be a silicon oxide layer or a silicon oxynitride layer, and may be formed by thermal oxidation and/or nitridation. The active region 106 may additionally be treated in a hydrogen-containing or nitrogen-containing ambient prior to the formation of the interfacial layer.

Figure 5D:
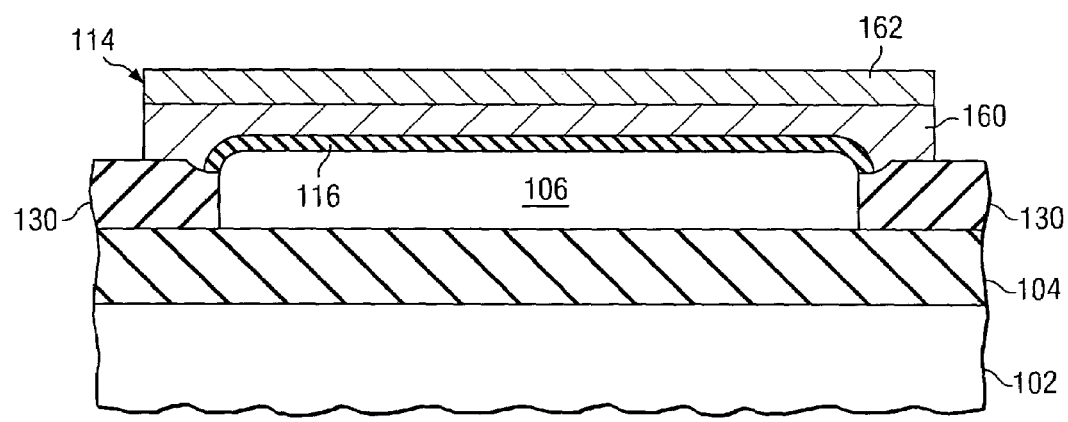

Referring now to FIG. 5d, the top electrode material 114 can then be deposited over the dielectric layer 116. The top electrode 114 material can be amorphous or polycrystalline silicon, polycrystalline silicon germanium, metals, metallic suicides, or metallic nitrides, as previously described. The electrode 114 material can be deposited by conventional techniques such as chemical vapor deposition. For example, the electrode 114 may also be formed by the deposition of silicon and metal, followed by an anneal to form a metal silicide electrode that includes silicon portion 160 and silicide portion 162. The electrode material is then patterned using photolithography techniques, and etched using plasma etch processes to form the electrodes 114.

The deposition of the top electrode material may be the same process step as the deposition of gate electrode material of a transistor to be formed in a different portion of the semiconductor chip, and the etching of the top electrode may similarly be accomplished together with the etching of the gate electrode of the said transistor. The completed top electrode is shown in FIG. 5d. The dielectric 118 is retained at least in the portion of the resistor covered by the electrode 114. Doping may be introduced in regions 110 and 112 (see FIGS. 1, 2 or 3c) adjacent to the body region 108 to make electrical contacts with the resistor body 108.

Figure 5E:
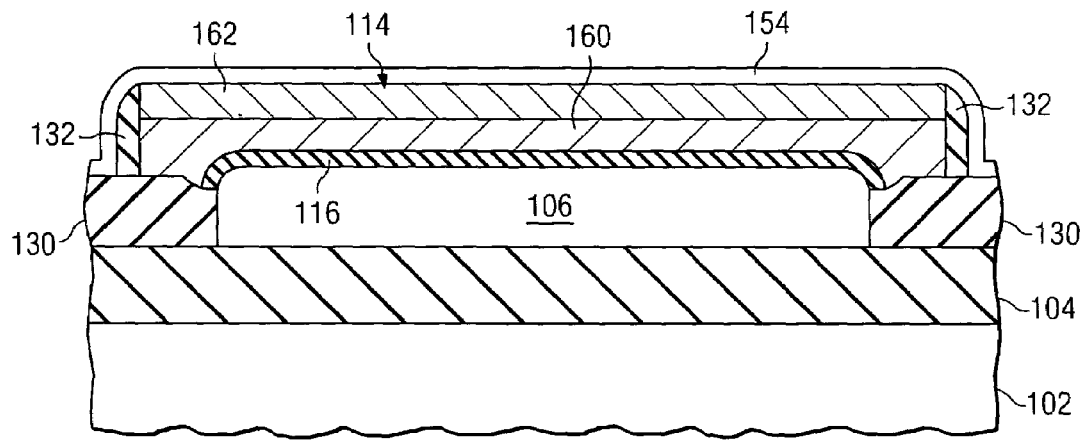
Figure 5F:
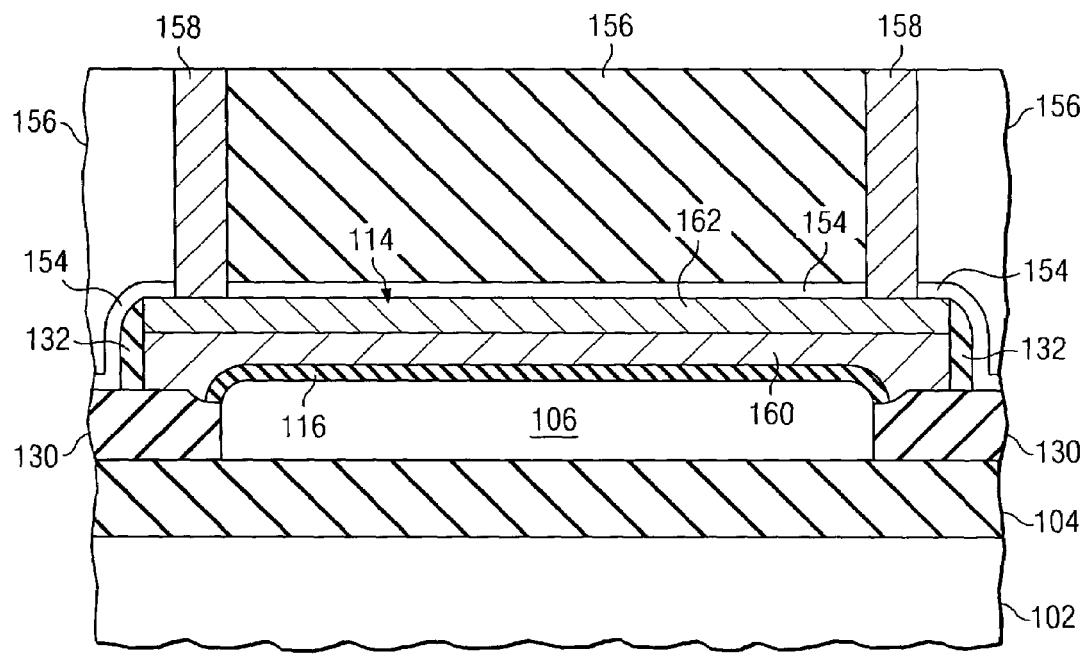

As shown in FIG. 5e, spacers 132 may be additionally formed on the sides of the electrode 114. This may be followed by another implant to the doped regions (110 and 112) of the active region 106 not covered by the spacers 132 or electrode 114. A contact etch-stop layer 154 may be formed on the electrode 114 and spacers 132. An inter-layer dielectric (ILD) 156 may be formed over the resistor and contact holes etched through the ILD 156 to reach the electrode 114 and the doped regions (110 and 112) of the resistor. Conductive materials (e.g., tungsten) are then used to fill the contact holes to form contact plugs 158, as shown in FIG. 5f.

Figure 6:
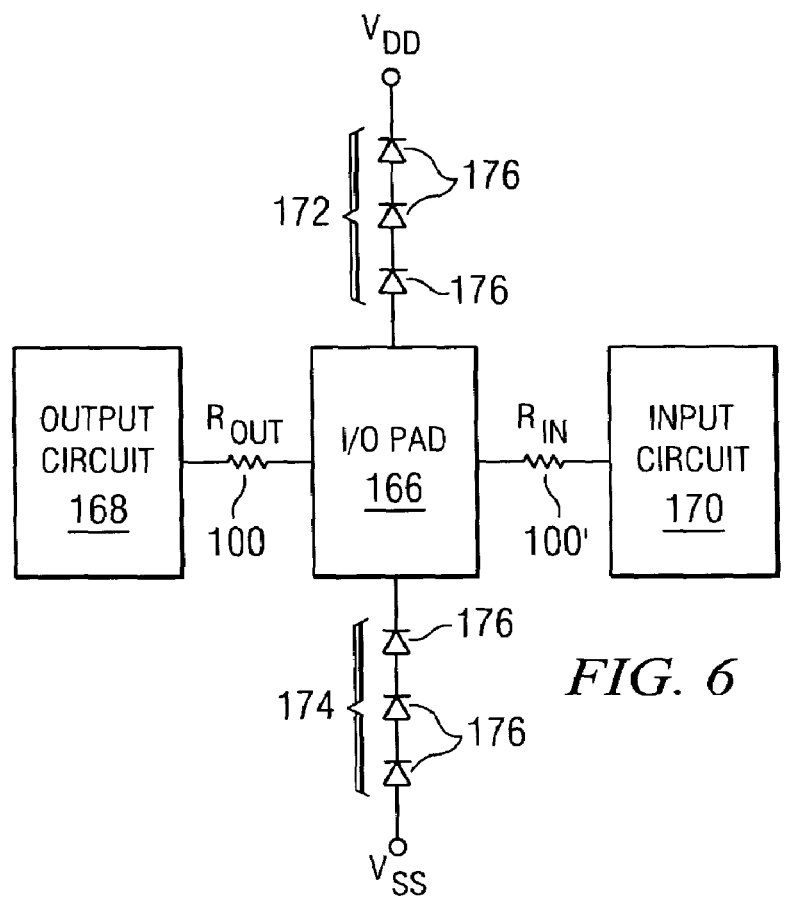
FIG. 6 shows an example of a circuit that can include a resistor of the present invention.

The resistor of the present invention can be used in a number of circuits. FIG. 6 provides but one example, namely an electrostatic discharge (ESD) protection circuit. This circuit will now be described.

FIG. 6 shows an example of how concepts of the present invention can be deployed for protection of integrated circuits. In this example, resistors 100 and 100' are coupled between an I/O pad 166 and two circuit portions 168 and 170. The resistors 100 and 100' can be any of the various embodiment resistors described in this specification. In this example, the circuit portion 168 is labeled as an output circuit and the circuit portion 170 is labeled as an input circuit. It is understood, however, that these circuit portions can be any circuit that should be shielded from high voltages.

The I/O pad 166 is provided to indicate any node that might be subject to a high voltage. The most typical of these nodes are the inputs and outputs between the chip and the outside world (e.g., external circuitry when connected to a system or handling devices when the system is being assembled). The pad 166 is indicated as being an I/O pad, which stands for input/output. It is noted, however, that in this patent the term I/O is meant to include pads for input only, output only or both input and output (or any other node that might be subject to a high voltage).

The circuit of FIG. 6, also shows a first diode string 172 coupled between a supply voltage source $V_{DD}$ (e.g., a voltage source of 5V, 3.3V, 2.5V or 1.8V) and the I/O pad 166 and a second diode string 174 coupled between a supply voltage source $V_{SS}$ and the I/O pad 166. Each diode string 172 and 174 includes one or more diodes 176. In the preferred embodiment, the diode 176 comprises a diode of the type described in co-pending application Ser. No. 10/641,813, which published as Patent Application Publication No. 2005/0035410 of Feb. 17, 2005 and which is incorporated herein by reference. For example, diode string 172 can include a diode 176 with a p-doped region coupled to I/O pad 166 and another 176 (or the same diode in a one diode string) with an n-doped region coupled to $V_{DD}$. The diode string 174 is coupled between the I/O pad 166 and the reference voltage $V_{SS}$ (e.g., ground). In this case, a p-doped region is coupled to ground and an n-doped region is coupled to the pad 166.

Figure 7:
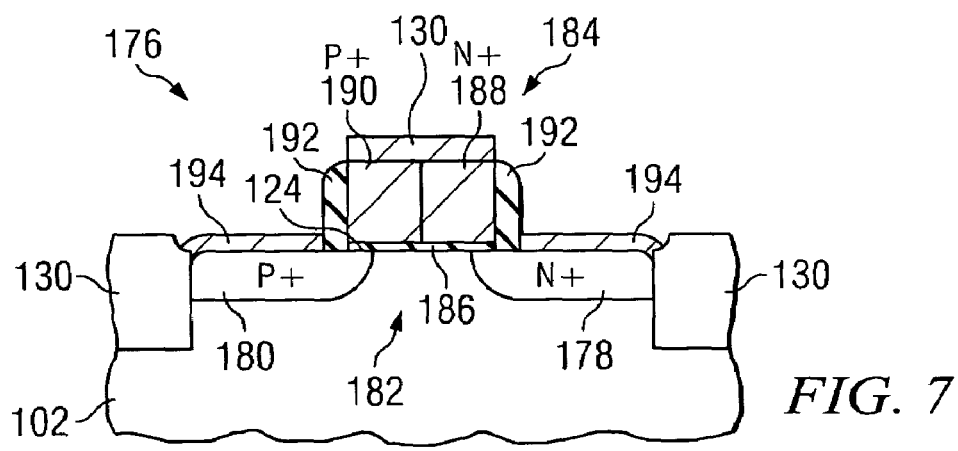
FIG. 7 shows an example of a diode that can be implemented on the same chip as a resistor of the present invention.

FIG. 7 shows a cross-sectional view of a gated diode 176. Except for reference numbers, FIG. 7 is the same as FIG. 4 in the co-pending '813 application. In the illustrated example, the diode 176 is formed in a bulk semiconductor substrate 102. In another example, the diode can be formed in the semiconductor layer 106 (e.g., of FIG. 1 or 2).

The gated diode 176 includes an n+ doped region 178 and a p+ doped region 180 that are separated by a body region 182. A gate 184 overlies the body region 182 and is separated therefrom by a dielectric 186. In the illustrated embodiment, the gate includes an n-doped portion 188 adjacent a p-doped portion 190. In other embodiments, other conductors can be used to form the gate 184. FIG. 7 also shows spacers 192 and conductive regions 194 (e.g., silicide) as described previously.

In the preferred embodiment, dielectric layer 186 comprises a high-k dielectric. In fact, the dielectric layer 186 can be formed from the same layer that is used to formed dielectric layer 116 for the resistors as described above. Combining process steps in the formation of resistors 100, diodes 176 and transistors 140 (e.g., components of circuits 168 and 170) simplifies the formation of circuits, such as the ESD protection circuit of FIG. 6.

While diode 176 is described herein with respect to a specific example, it is understood that any of the variations and embodiments described in the co-pending and incorporated '183 application can be utilized in the present invention.

In the foregoing specification, the invention has been described with reference to specific embodiments. However, various modifications and changes can be made by one skilled in the art without departing from the scope of the preferred embodiment. Accordingly, the specification and figures are to be regarded in an illustrative rather than a restrictive sense, and all such modifications are intended to be included within the scope of the preferred embodiment.

What is claimed is:

1. A method of forming a resistor, the method comprising:
    providing a silicon-on-insulator substrate that includes a silicon layer overlying an insulator layer;
    forming a resistor body of a first conductivity type in a portion of the silicon layer;
    forming a dielectric layer overlying the body region, the dielectric layer comprising a material with a relative permittivity greater than about 8;
    forming a top electrode on the dielectric layer, the top electrode comprising a conductive material; and
    forming a pair of doped regions of the first conductivity type oppositely adjacent the body region.

2. The method of claim 1 wherein forming the resistor body comprises:
    forming an active region;
    forming isolation regions surrounding the active region; and
    doping the active region.

3. The method of claim 2 wherein doping the active region employs an ion implantation with a dose in the range of about $10^{13}$ to about $10^{16}$ cm$^{-2}$.

4. The method of claim 1 wherein forming the dielectric layer comprises a chemical vapor deposition step.

5. The method of claim 1 wherein forming the dielectric layer comprises a sputtering deposition step.

6. The method of claim 1 wherein forming the dielectric layer comprises:
    forming an interfacial oxide layer; and
    forming a high permittivity dielectric layer.

7. The method of claim 1 wherein forming the pair of doped regions comprises:
    doping a portion of the silicon layer not covered by the top electrode;
    forming spacers on sidewalls of the top electrode; and
    doping a portion of the silicon layer not covered by the top electrode and the spacers.

8. The method of claim 7 wherein the spacers comprise silicon nitride.

9. The method of claim 7 further comprising:
    depositing an etch-stop layer over the top electrode and the spacers;
    forming an inter-layer dielectric over the etch-stop layer;
    forming contact holes in the inter-layer dielectric layer; and
    filling the contact holes with a conductive material to form contact plugs.

10. The method of claim 9 wherein the etch-stop layer comprises silicon nitride.

11. The method of claim 9 wherein the inter-layer dielectric comprises silicon oxide.

12. The method of claim 9 wherein a first contact plug electrically contacts one of the pair of doped regions and a second contact plug electrically contacts the top electrode, said first and second contact plugs being electrically connected.

13. The method of claim 1 wherein the insulator layer comprises silicon oxide.

14. The method of claim 1 wherein the insulator layer has a thickness of less than about 1200 angstroms.

15. The method of claim 1 wherein the silicon layer has a thickness in the range of about 20 angstroms to about 1000 angstroms.

16. The method of claim 1 wherein the top electrode comprises a doped semiconductor.

17. The method of claim 1 wherein the top electrode comprises a metal selected from the group consisting of molybdenum, tungsten, titanium, tantalum, platinum, and hafnium.

18. The method of claim 1 wherein the top electrode comprises a metallic nitride selected from the group consisting of molybdenum nitride, tungsten nitride, titanium nitride, tantalum nitride, or combinations thereof.

19. The method of claim 1 wherein the top electrode comprises a metallic silicide selected from the group consisting of nickel silicide, cobalt silicide, tungsten silicide, titanium silicide, tantalum silicide, platinum silicide, and erbium silicide, and combinations thereof.

20. The method of claim 1 wherein the top electrode comprises a metallic oxide selected from the group comprising of ruthenium oxide, and indium tin oxide, and combinations thereof.

21. The method of claim 1 wherein the dielectric layer comprises a material selected from the group consisting of aluminum oxide, hafnium oxide, hafnium oxynitride, hafnium silicate, zirconium oxide, zirconium oxynitride, and zirconium silicate, and combinations thereof.

22. The method of claim 1 wherein the dielectric layer has a relative permittivity of larger than about 10.

23. The method of claim 1 wherein the dielectric layer has a relative permittivity of larger than about 20.

24. The method of claim 1 wherein the dielectric has a physical thickness greater than about 5 angstroms.

25. The method of claim 24 wherein the dielectric has a physical thickness greater than about 20 angstroms.

26. The method of claim 25 wherein the dielectric has a physical thickness greater than about 40 angstroms.

27. The method of claim 1 wherein the electrode has a width greater than about 0.1 microns.

28. The method of claim 1 wherein the electrode has a width greater than about 1 micron.

29. The method of claim 1 the electrode has a length greater than about 0.1 microns.

30. The method of claim 2 wherein the electrode has a length greater than about 1 micron.

* * * * *